United States Patent
Nagori

(10) Patent No.: US 7,289,047 B2
(45) Date of Patent: Oct. 30, 2007

(54) DECODING VARIABLE LENGTH CODES WHILE USING OPTIMAL RESOURCES

(75) Inventor: Soyeb N Nagori, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/467,581

(22) Filed: Aug. 28, 2006

(65) Prior Publication Data

US 2007/0024473 A1 Feb. 1, 2007

Related U.S. Application Data

(62) Division of application No. 11/162,370, filed on Sep. 8, 2005, now Pat. No. 7,119,723.

(60) Provisional application No. 60/595,692, filed on Jul. 28, 2005.

(51) Int. Cl.
*H03M 7/40* (2006.01)
(52) U.S. Cl. .......................................... 341/67; 341/65
(58) Field of Classification Search ................ 341/67, 341/65, 79
See application file for complete search history.

(56) References Cited

U.S. PATENT DOCUMENTS

| 4,930,095 | A | * | 5/1990 | Yuchi et al. | 702/87 |
| 5,345,410 | A | * | 9/1994 | Yokoyama et al. | 708/491 |
| 5,488,366 | A | | 1/1996 | Wu | |
| 5,973,627 | A | | 10/1999 | Bakhmutsky | |
| 2004/0039900 | A1 | * | 2/2004 | Heishi et al. | 712/234 |

* cited by examiner

*Primary Examiner*—Brian Young
(74) *Attorney, Agent, or Firm*—Robert D. Marshall, Jr.; W. James Brady; Frederick J. Telecky, Jr.

(57) ABSTRACT

In one aspect, code-words of variable lengths are decoded using a multi-stage decoding approach, with different stages being of different sizes (and thus accepting input data of corresponding number of bits). According to another aspect, the same bit positions are used for storing symbol information and offset value in case of hit and miss results respectively, thereby reducing the width of the entries of the decoding table. According to yet another aspect, conditional processing is avoided by providing a common arithmetic operation when decoding code-words in various escape modes, but using neutral operand values in case the operation is not required.

16 Claims, 10 Drawing Sheets

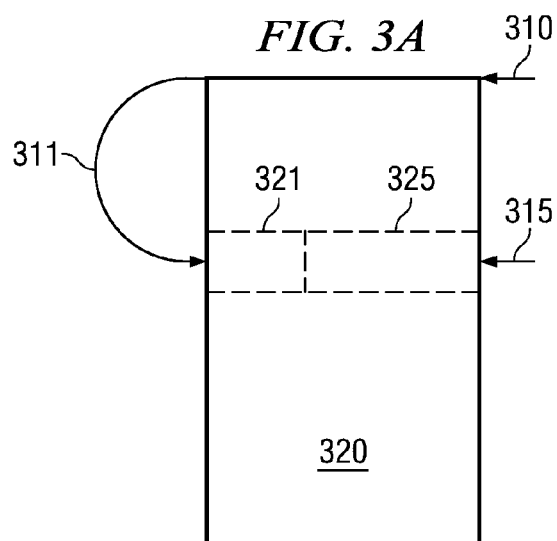
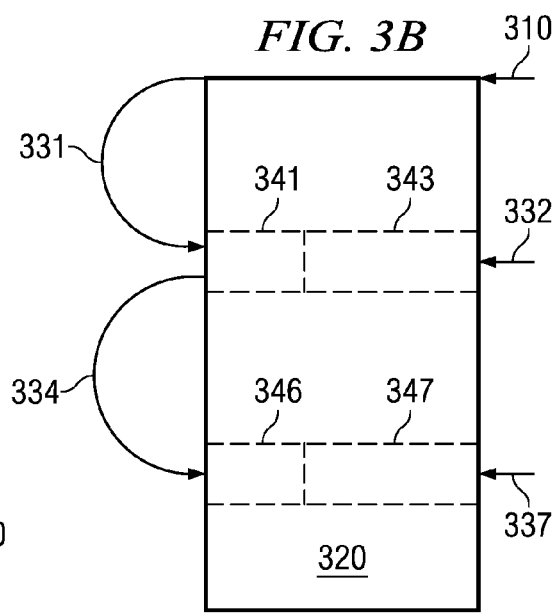
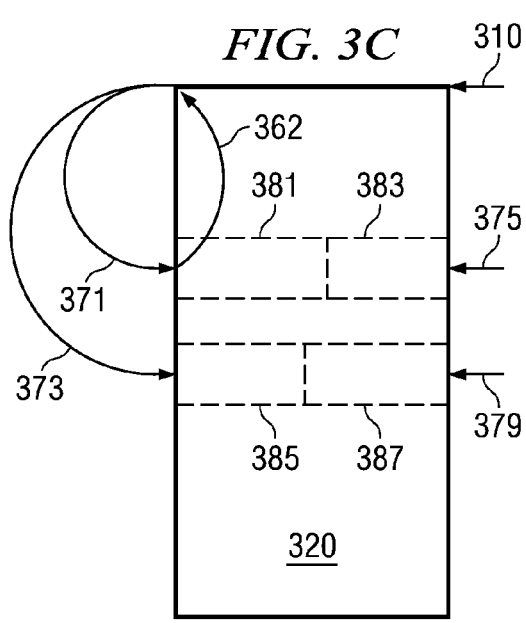

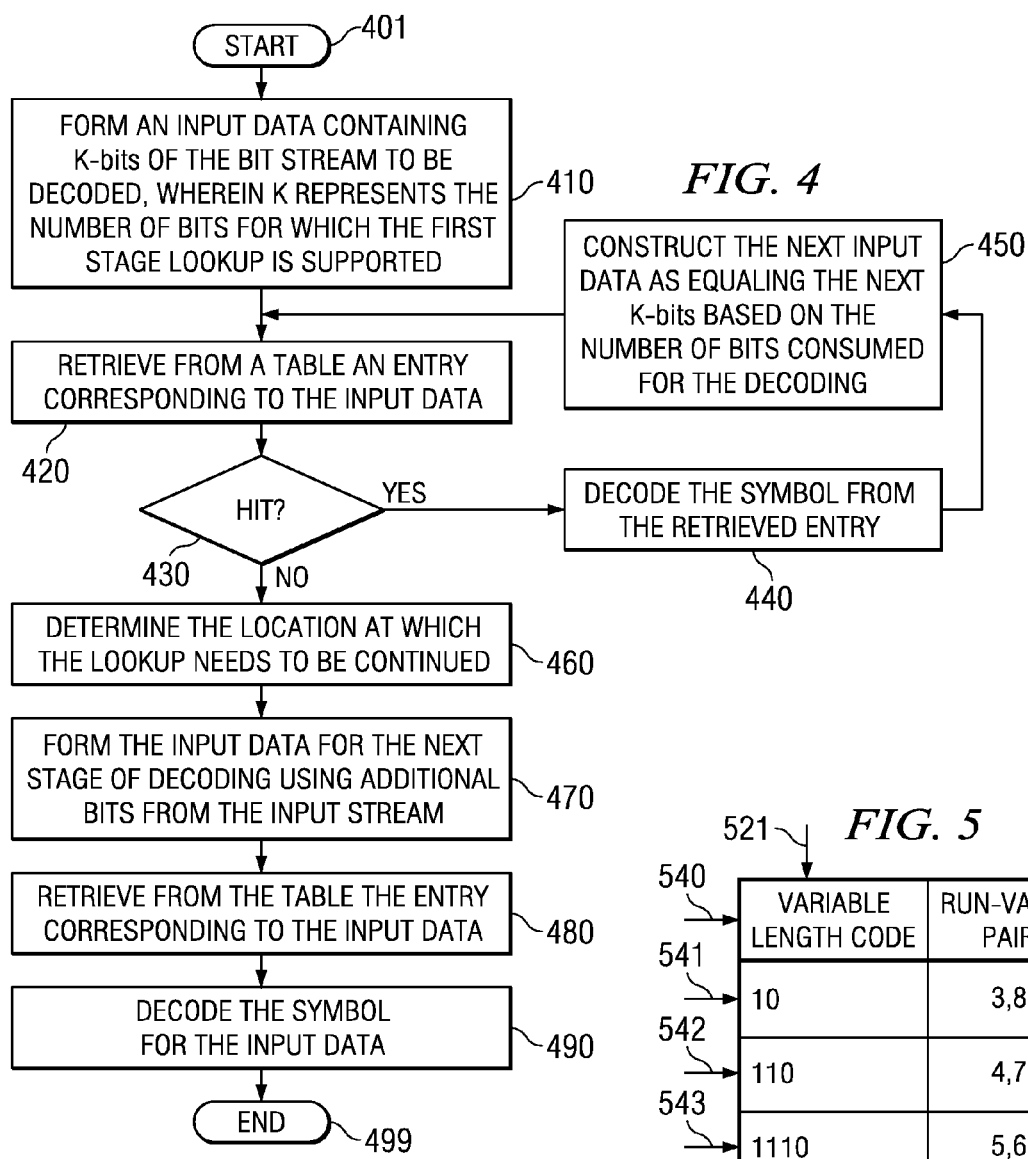

| | SERIAL NUMBER | INPUT DATA | HIT/MISS (1/0) | SYMBOL | OFFSET | CONSUMED COUNT | |
|---|---|---|---|---|---|---|---|
| 612 → | (0) | 00000 | 0 | 0 | 64 | 5 | 691 |
| | | 00001 | 0 | 0 | 0 | 5 | |
| 613 | | - | | | | | |
| | | 10000 | 1 | 3,8 | 0 | 2 | |
| 614 | | - | | | | | |
| | | 10110 | 1 | 3,8 | 0 | 2 | |
| 615 | | - | | | | | |
| | | 11000 | 1 | 4,7 | 0 | 3 | |
| 616 | | - | | | | | |
| | | 11100 | 1 | 5,6 | 0 | 4 | |
| 617 | | - | | | | | |
| | | 11110 | 1 | 6,5 | 0 | 5 | |
| | (31) | 11111 | 0 | 0 | 32 | 5 | |
| 621  618 | | | | | | | |
| → | (32) | 00000 | 1 | 7,4 | 0 | 1 | 692 |
| 622 | | - | | | | | |
| | | 10000 | 1 | 8,3 | 0 | 2 | |
| 623 | | - | | | | | |
| | | 11000 | 1 | 9,2 | 0 | 3 | |
| 624 | | - | | | | | |
| | | 11100 | 1 | 10,1 | 0 | 4 | |
| 625 | | - | | | | | |
| | | 11110 | 1 | 11,0 | 0 | 5 | |
| 626 | | - | | | | | |
| | | 11111 | 0 | 0 | 0 | 5 | |
| 631 | | | | | | | |
| 632 → | (64) | 00111 | 1 | ESC1 | 0 | 3 | |
| | | 01111 | 1 | ESC2 | 0 | 3 | |
| | | 01111 | 1 | ESC3 | 0 | 3 | 693 |

*FIG. 6*

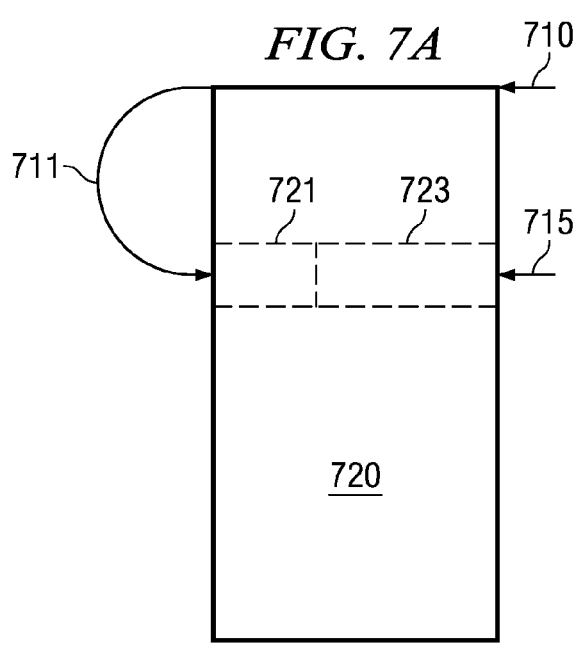
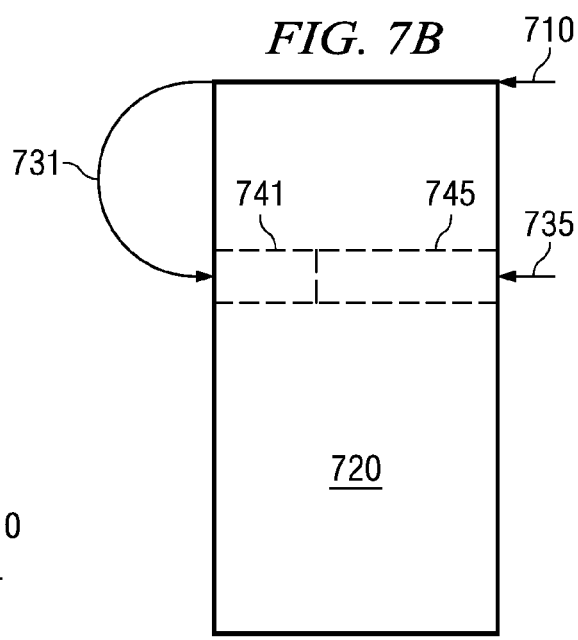
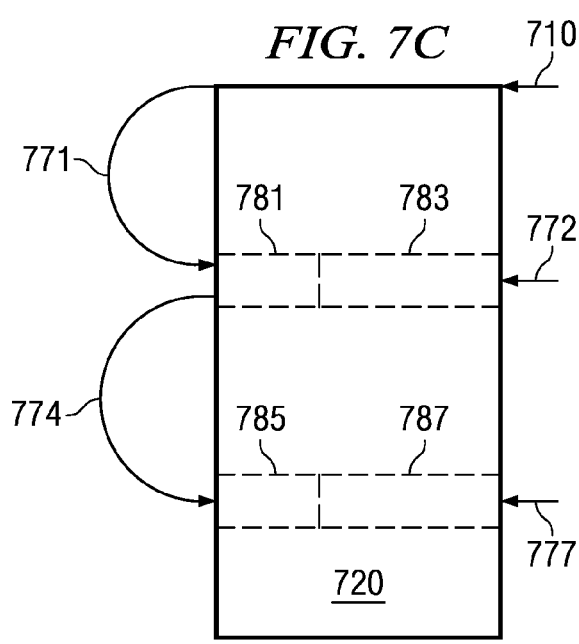

| INPUT DATA | HIT COUNT | SYMBOL/ (OFFSET, SHIFT AMOUNT) | CONSUME COUNT |
|---|---|---|---|
| (0) 00000 | 0 | 64,29 | 5 |
| 00001 | 0 | 0,28 | 5 |
| \| | \| | \| | \| |
| 10000 | 1 | 3,8 | 2 |
| \| | \| | \| | \| |
| 10110 | 2 | 3,8&4,7 | 5 |
| \| | \| | \| | \| |
| 11010 | 2 | 4,7&3,8 | 5 |
| \| | \| | \| | \| |
| 11100 | 1 | 5,6 | 4 |
| \| | \| | \| | \| |
| 11110 | 1 | 6,5 | 5 |
| (31) 11111 | 0 | 32,27 | 5 |
|  |  |  |  |
| (32) 00000 | 1 | 7,4 | 1 |
| \| | \| | \| | \| |
| 10000 | 1 | 8,3 | 2 |
| \| | \| | \| | \| |
| 11010 | 2 | 9,2&3,8 | 5 |
| \| | \| | \| | \| |
| 11100 | 1 | 10,1 | 4 |
| \| | \| | \| | \| |
| 11110 | 1 | 11,0 | 5 |
| \| | \| | \| | \| |
| (63) 11111 | 0 | 0 | 5 |
| (64) 001 | 0 | ESC1,27 | 3 |
| \| | \| | \| | \| |
| 010 | 0 | ESC2,27 | 3 |
| \| | \| | \| | \| |
| 011 | 0 | ESC3,27 | 3 |

*FIG. 10*

| | 1231 | 1232 | 1233 | 1234 | 1235 | 1236 | 1237 |
|---|---|---|---|---|---|---|---|
| 1211 | 0 | 0 | 0 | 0 | 0 | 0 | 0 |
| 1212 | LMAX1 | LMAX2 | LMAX3 | LMAX4 | LMAX5 | LMAX6 | LMAX7 |
| 1213 | 0 | 0 | 0 | 0 | 0 | 0 | 0 |

| | 1281 | 1282 | 1283 | 1284 | 1285 | 1286 | 1287 |
|---|---|---|---|---|---|---|---|
| 1261 | 0 | 0 | 0 | 0 | 0 | 0 | 0 |
| 1262 | 0 | 0 | 0 | 0 | 0 | 0 | 0 |
| 1263 | RMAX1+1 | RMAX2+1 | RMAX3+1 | RMAX4+1 | RMAX5+1 | RMAX6+1 | RMAX7+1 |

US 7,289,047 B2

DECODING VARIABLE LENGTH CODES WHILE USING OPTIMAL RESOURCES

RELATED APPLICATIONS

This application is a divisional application of U.S. patent application Ser. No. 11/162,370 filed Sep. 8, 2005 now U.S. Pat. No. 7,119,723; which claims priority to U.S. Provisional Application Ser. No. 60/595,692, filed Jul. 28, 2005.

The present application is related to the co-pending U.S. Provisional Patent Application Ser. No. 60/595,692, entitled, "Variable Stage-Size Multi-symbol Variable Length Decoding", filed on 2005, Jul. 28, naming as inventor: Soyeb Nagori, and is incorporated in its entirety herewith.

BACKGROUND

1. Field of the Invention

The present invention relates generally to compression technologies, and more specifically to a method and apparatus for decoding variable length codes (e.g., Huffman Encoding) while using optimal resources.

2. Related Art

Symbols are often encoded using variable length codes. Huffman encoding provides an example approach to such encoding. Variable length encoding has been used in several environments, typically due to the loss-less nature and the level of compression achieved.

In a typical scenario, an encoder encodes each input symbol to a corresponding bit string (code word) using a pre-specified table, with the length of code-word potentially being different for different input symbols. In general, short length code words are chosen for frequently occurring input symbols. A decoder then receives a bit stream containing such variable length codes and constructs the symbols by using the inverse encoding tables (or corresponding information).

Several resources are generally required to decode the input symbols (or a stream of bits forming a sequence of symbols). For example, memory is required to store the tables used for decoding, and computational resources are required to perform various look-up and other operations to support the decoding task. Approaches may require more of one type of resource, while attempting to reduce requirements of other types of resources.

It is generally desirable to optimize the resource requirements while decoding variable length code words.

BRIEF DESCRIPTION OF THE DRAWINGS

Various features of the present invention will be described with reference to the following accompanying drawings.

FIGS. 3A-3C together illustrate the manner in which a variable length code-word is decoded in multiple stages according to an aspect of the present invention.

FIG. 4 is a flowchart illustrating the manner in which variable length code-words are decoded in multi-stages according to an aspect of the present invention.

FIG. 5 contains a table illustrating an example set of code-words and corresponding run-value pair (symbols) used to illustrate the operation of various embodiments described in the present application.

FIG. 6 depicts three table portions supporting the decoding of symbols, potentially in three corresponding stages.

FIGS. 7A-7C broadly illustrate an approach using which multiple symbols are potentially decoded in a single table lookup, according to several aspects of the present invention.

FIG. 10 is a table corresponding to the Huffman codes of FIG. 5, but designed to facilitate multi-symbol decoding according to various aspects of the present invention

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
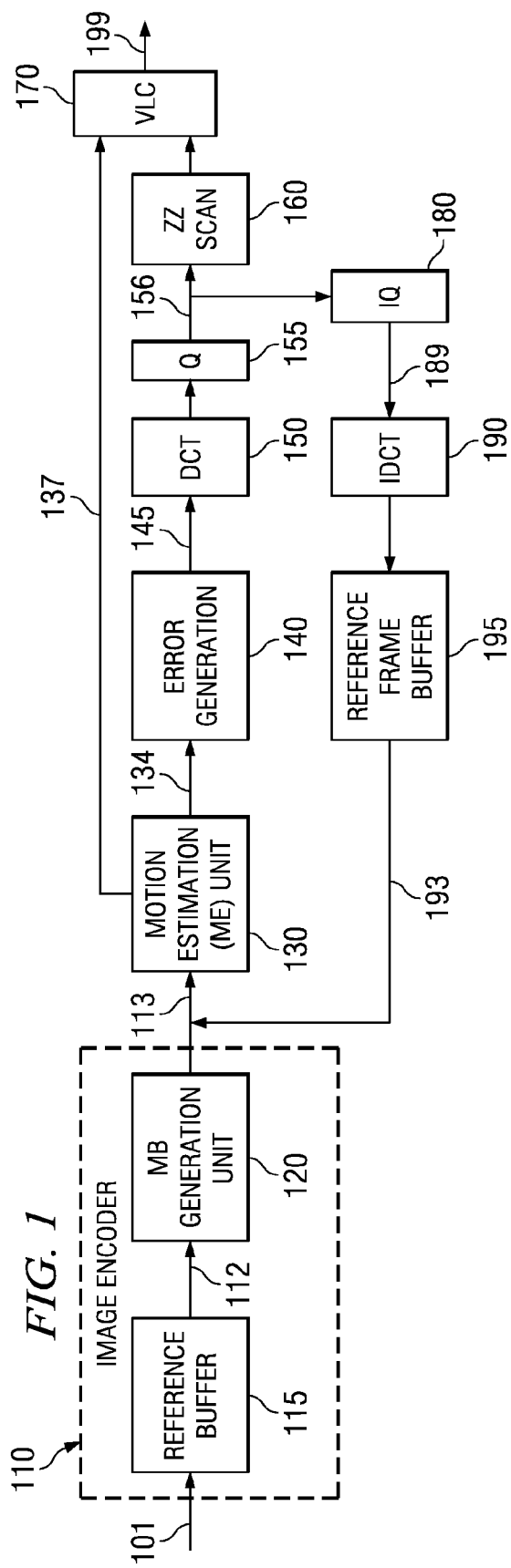
FIG. 1 is a block diagram of the relevant portion of a digital video encoder device in an embodiment of the present invention.

A decoding approach provided according to an aspect of the present invention decodes symbols in a sequence of stages, with different stages potentially being of different sizes. Due to such different sizes, the available memory space may be used efficiently in decoding variable length codes.

In an embodiment, each stage receives a corresponding number of bits as input data (which determines the size of the stage) and provides an entry (based on the input data) from a corresponding table. The provided entry indicates whether there is a hit (i.e., the symbol can be decoded from the entry) or miss for the received input value. In case of a hit, the corresponding table entry provides the decoded symbol as well as the number of bits of the input combination consumed due to the hit.

In case of a miss, the corresponding table entry indicates the specific location of the lookup table of the subsequent stage at which the decoding should be continued. In one implementation, the specific location is indicated as an absolute number from the start location of the first stage. In addition, the number of additional bits to be used in the lookup in the subsequent stage, is also indicated, which permits the later stage to be operated using a different number of bits as input data.

Another aspect of the present invention stores a value representing (word length—N) in an entry corresponding to a miss, with N representing the number of bits to be used in the next stage. Due to the storing of such a value, the computational requirements are reduced in providing the input data for the next stage.

One more aspect of the present invention reduces conditional processing in decoding when input symbols are encoded according to escape modes (requiring different arithmetic operations in case of different escape modes). The conditional processing is reduced by providing common arithmetic operations for all the possible modes and using neutral operands (addition by 0 or multiplication by 1) in case the corresponding operation is not required for a specific mode.

In an embodiment, a table structure used for decoding, is designed to facilitate such common arithmetic operations. Accordingly, the table entries would contain 0/1 value for the neutral operation, or the specific value for escape mode operations in the same field.

Yet another aspect reduces conditional processing when processing code-words received according to an escape mode (3, for illustration), which requires processing outside of a loop (with the loop processing the other cases of escape modes and table mode). In an embodiment, the processing within the loop is continued based on a counter which counts the number of blocks processed, and the loop is exited when the counter exceeds a threshold. A common field is used for all the possible cases, with the field containing a value of 0 in case the code-word indicates that the end of block is not reached and the code-word does not correspond to processing according to escape mode 3, a value of 1 in case the code-word corresponds to a situation in which the end of block is reached, and a large value in case of escape mode 3.

The value in the field is added to the counter (or subtracted, depending on the logic) and the loop is exited when the counter reaches the threshold. Thus, by choosing the value sufficiently high in case of entries corresponding to escape mode, the loop can be exited and the code-words can be processed with a logic suited for escape mode 3. The loop is re-entered with the accurate block count.

Another aspect of the present invention reduces the word length when decoding multiple symbols in a single lookup based on the recognition that the later (second, in case of decoding two symbols in a single lookup) code-word would correspond to a symbol of shorter length (compared to the earlier symbol). Accordingly, the length of the field (number of bits) for the later symbols is allocated to be shorter than the length of the field for the first symbol in the sequence of symbols decoded for a single lookup.

Yet another aspect of the present invention avoids unneeded long word-length by using the same bit positions for storing information needed only in mutually exclusive scenarios. Thus, the same bits positions used for decoding code-words in table mode, are also used for storing offset information in case of escape modes. However, the same bit positions are used for storing similar information to avoid conditional processing.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

2. Example Environment

Figure 2:
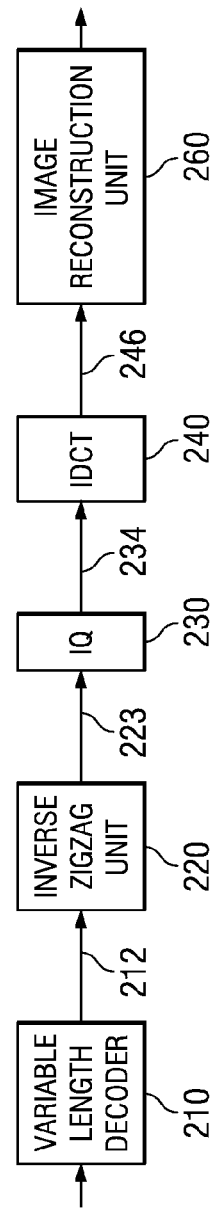
FIG. 2 is a block diagram of a relevant portion of a digital video decoder device in an embodiment of the present invention.

FIGS. 1 and 2 together represent an example environment in which various aspects of the present invention can be implemented. Only the details of the components as believed to be relevant to an understanding of the operation of the described embodiments are provided in this application for conciseness. For further details, the reader is referred to documents related to the MPEG-4 Standards, well known in the relevant arts.

Broadly, FIG. 1 represents a digital video encoder device which compresses video frames into a format suitable for transmission/storage, and FIG. 2 represent a video decoder device reproducing the video frames. Even though shown as part of different devices, the components of the two Figures are often implemented in a single component (codec)/device, capable of both image capture and reproduction.

Continuing with respect to FIG. 1, the block diagram is shown containing image encoder 110, motion estimation (ME) unit 130, error generation unit 140, discrete cosine transform (DCT) unit 150, quantization unit (Q) 155, zigzag (ZZ) scan unit 160, variable length coder (VLC) 170, inverse quantization (IQ) unit 180, inverse DCT (IDCT) unit 190 and reference frame buffer 195. Each block is described below in further detail.

Image encoder 110 generates macro blocks (MB) on path 113 from video signal received on path 101. The video signal may be received in the form of a sequence of frames, with each frame containing multiple pixels. Each pixel is represented digitally in YCrCb format (well known in the art), wherein Y represents the luminance and Cr, Cb respectively represent the red and blue color difference of a pixel. A video image containing 720*480 pixels can be logically divided into 1350 16*16 macro-blocks.

Each macro block (16×16 pixels) may be represented in formats such as 4:2:0 and 4:2:2 as well known in the relevant art. For example, in case of 4:2:0 format, each macro block contains six blocks (each block is of size 8×8 pixels), with 4 blocks representing Y(luminance), one block representing Cr and one block representing Cb.

Image encoder 110 is shown containing buffer 115 and MB generation unit 120. Buffer 115 holds an input frame received on path 101 for encoding and transmission (typically using various prediction approaches). MB generation unit 120 receives the input frame on path 112 and divides the input frame into a number of macro blocks (MB) noted above. Each macro block is provided on path 113 for further processing.

Motion estimation unit 130 receives a macro block on path 113 (input macro block) and a reference frame on path 193 (from reference frame buffer 195) and generates a motion vector. The motion vector generated generally represents a distance and direction in which an image portion (represented by macro block) has moved. The generated motion vector is provided on path 137.

Error generation unit 140 generates a residue macro block representing a difference (error) in the input macro block and corresponding reference macro block (obtained from reference frame buffer 195). The received macro block and reference macro blocks may be received either directly from respective paths 113 and 193 or may be received from motion estimation unit 130. The residue macro block is provided to DCT 150 on path 145.

Discrete cosine transform (DCT) unit 150 receives residue macro block from error generation unit 140 and provides a DCT coefficient block on path 156 as described in below paragraphs. DCT unit 150 performs discrete cosine transform (well known in the relevant arts) on the received residue macro blocks. DCT may be performed consistent with the format of macro block received. For example, macro block having format 4:2:0 may be divided into 4 luminance blocks and two chrominance blocks, and DCT may be performed on each block (8*8 pixel) sequentially.

Typically, a two dimensional DCT performed on each block (8*8 pixels) produces a block of DCT coefficients representing contribution of a particular combination of horizontal and vertical spatial frequencies in the original picture block. In an embodiment, DCT performed on an 8×8 block of 8 bit pixels produces DCT block of 8×8 with 11 bit coefficients. The coefficients at the lower frequencies typically contain higher energy (magnitude) and the energy content of other coefficients tend to zero. Quantization unit (Q) 155 quantizes the two dimensional DCT coefficient blocks and the quantized DCT values are provided on path 156 to zigzag scan unit 160.

IQ 180 receives the quantized values of DCT coefficient on path 156. IQ 180 supplies dequantized data on lines 188 to IDCT 190 which constructs a corresponding picture block by performing an inverse of discrete cosine transform. The constructed picture blocks are stored as reference frames in a reference frame buffer 195. The reference frames are provided to motion estimation unit 130 on path 193 for motion prediction.

Zigzag scan unit 160 receives each quantized DCT coefficient block on path 156 and transforms the DCT coefficient block into one dimensional data suitable for variable length coding. Typically, the sequence of coefficients are picked such that both horizontal and vertical frequency increase in this order, and the variance of the coefficients decrease in the order. In one embodiment, the sequence of data is represented using a sequence run and value pairs (run-value pair) as described in further detail below. A run generally represents a number of zeroes before a non-zero value. The run-value pairs are provided to VLC 170.

Variable length coder (VLC) 170 generates a variable length code-word for each run value pair received received from zigzag scan unit 160. Variable length code-word may be generated using technique such as Huffman encoding etc. Generally, VLC 170 converts a run-value pair into a run-value-last triplet and generates a variable length code-word for each run-value-last triplet ("input symbol" in this embodiment). Here "last" indicates if the run-value pair is the last such pair in a given block.

The generated code-word are transmitted on path 199 in a desired format. Typically the information representing motion vectors, block formats, block size, etc., are transmitted as metadata along with the code words. The manner in which a bit stream representing the code-words may be processed to construct the video frames is described below with reference to FIG. 2.

3. Receiving Components

FIG. 2 is a block diagram illustrating the manner in which code words are processed to produce video frames for display. The block diagram is shown containing variable length decoder 210, inverse zigzag unit 220, inverse quantization unit (IQ) 230, inverse DCT (IDCT) 240, and image construction unit 260.

Inverse zigzag unit 220, inverse DCT (IDCT) 240, inverse quantization unit (IQ) 230, and image construction unit 260 respectively perform the reverse operation of zigzag (ZZ) scan unit 160, discrete cosine transform (DCT) unit 150, quantization unit 155 and a combination of blocks image encoder 110, motion estimation (ME) unit 130. The components are described only briefly further, for conciseness.

Inverse zigzag unit 220 generates a quantized DCT coefficients block from a run-value-last triplet received from variable length decoder 210. The size of the block is generally obtained from the metadata transmitted along with code-word as noted above. Inverse quantization unit (IQ) 230 receives data from inverse zigzag unit 220 on path 223 and performs inverse quantization and generates a DCT coefficients block. The generated DCT coefficient blocks are then provided to IDCT 240 on path 234.

Inverse DCT (IDCT) unit 240 performs inverse discrete cosine transform on the received set of coefficients (block) and generates pixel values in Y(luminance), Cr and Cb (color information) format. The generated pixels are generally provided as an image table. Image construction unit 260 receives via path 246 the image information from the image table and metadata, to generate each frame of image for display.

Variable length decoder 210 decodes a sequence of codewords (contained in the sequence of bits received from the digital video encoder of FIG. 1) and generates the corresponding triplets (run-value-last triplet/symbols) corresponding to the code-words. Variable length decoder 210 may extract various metadata information and present the metadata information as a table. The triplets are provided to inverse zigzag unit 220 via path 212.

In general, the decoding operation needs to be consistent with the encoding operation. Accordingly an example encoding approach is described first below.

4. Example Encoding Approach

In the example approaches described herein, a four mode VLC (variable length coding) is employed. The four modes are referred to as the default table mode, level escape mode (escape mode 1), run escape mode (escape mode 2) and full escape mode (escape mode 3). In the table mode, a (VLC) table exists (such as Huffman table for Huffman encoding), which maps the most commonly occurring run-level-last triplets to their corresponding variable length code words.

Generally, Huffman (VLC) table in such an embodiment is characterized by two parameters LMAX and RMAX. LMAX represents the maximum level of a given run listed in the table. RMAX represents the maximum run for the given level represented in the table. Accordingly a received run-value pair is encoded in default table mode when received level is less than or equal to LMAX and received run value is less than or equal to RMAX ((level<=LMAX) and (run<=RMAX)). In this case, the code-word is obtained by indexing into the code-word table, using the level and run values.

Received run-value pair is encoded in level escape mode when received level value is greater than LMAX and less than twice of LMAX, and received run value is less than RMAX ((LMAX<level<=2*LMAX) and (run<=RMAX)). In such case, a new run-level pair is generated as new run=run and new level=level−LMAX. The new run and new level is encoded according default table mode and corresponding code word is transmitted with a prefix code representing level escape mode.

Similarly, a run escape mode is used when RMAX<run<= (2*RMAX+1) and (level<=LMAX). The new run-level pair is generated as newrun=run−(RMAX+1) and new level=level. New run and new level is encoded according to default table mode and the corresponding code word is transmitted with a prefix code representing run escape mode.

In the full escape mode, VLC 170 encodes the received run-value pair with an escape code followed by the actual run, length and last values. The full escape mode is used when the received run-level pair does not satisfy any of the above conditions. In the full escape mode, the code-word comprises of a predefined number of bits, that are used to send the run, level and last values without any encoding.

Decoding of the code word needs to be performed consistent with the encoding operation described above. Various aspects of the present invention decode the code-words while using optimal resources. The advantages of the invention can be appreciated in comparison to some prior approaches. Accordingly, the prior decoding approaches are described briefly below.

5. Some Prior Decoding Approaches

In one prior decoding approach, a table containing 2N (wherein  represents 'power of' relationship and N represents the maximum length of the code-words) entries is used. Thus, when a stream of input bits need to be decoded, N next un-decoded bits of the stream are used to look-up the table, and a match would always result. The entry in the table would indicate the decoded symbol as well as the number of bits consumed due to the decoding. The next N-bit input to the table includes any un-decoded bits in the prior lookup/iteration.

An advantage of such approach is that a symbol is decoded every lookup, thereby potentially leading to enhanced throughput performance. However such an approach has the disadvantage of requiring memories of large size, and may be particularly undesirable for large values of N. Such solutions may not be suited in environments such as embedded systems, which operate from small memories.

An alternative approach overcomes such high memory requirements. In such an approach, a storage structure supporting a binary tree is used. The leaf nodes of the binary tree contain the decoded symbols, while the non-leaf nodes provide a corresponding path for further search. The tree is traversed to decode each input code-word.

Such an alternative approach may require reduced size memories. However, the approaches would require more look-ups/iterations to reach the leaf nodes, and thus the computational requirements are increased.

Some features of the present invention are applicable to multi-stage decoding and also decoding multiple symbols in a single table lookup. Accordingly, the description is continued with respect to multi-stage decoding and decoding multiple symbols in a single table lookup.

6. Multi-Stage Decoding in General

FIGS. 3A-3C together illustrate the manner in which a variable length code-word is decoded in multiple stages. In particular, FIG. 3A illustrates the decoding in a single lookup, FIG. 3B illustrates the decoding in two look-ups (in two different stages), and FIG. 3C illustrates the decoding of escape mode code word in multiple look-ups, as described below in further detail.

Continuing with reference to FIG. 3A, shown there is memory 320 with a starting address 310. A table entry stored at location 315 contains fields 321 and 325. Field 321 provides information representing a hit, and field 325 provides corresponding decoded symbol and other relevant information such as number of bits consumed for decoding, etc. Assuming that the K-bit input value is used as an index into the table from the start of table 310, and that the K bit input represents a value 311, a symbol provided in field 325 is used as decoded symbol in one look-up/iteration.

Similarly in FIG. 3B, memory 320 is shown having table entries at locations 332 and 337. Table entry in location 332 is shown containing fields 341 and 343. Information representing a miss is stored in field 341. Field 343 contains an offset value (or other indication of where to continue the search/lookup) along with the number of extra bits required for further decoding. Table entry at location 337 is shown containing field 348 representing a hit and field 347 providing corresponding symbol and relevant information.

When a k bit input data represents an index value 331, field 341 of the first look-up indicates a miss, as noted above. Field 343 indicates that an offset value equaling 334 is to be used for further search, and the additional bits required for the search (lookup). Accordingly, in the second iteration/lookup, the additional bits are used (potentially added) to access the entry containing fields 346 and 347. As field 346 indicates a hit, field 347 would contain the decoded value. Thus, in FIG. 3B, two lookup operations are used to decode a single symbol.

With respect to FIG. 3C, field 381 of entry 375 indicates that the code-word (input data) represents an escape code, and the search needs to be continued at a location pointed by field 383. Entry 379 contains the data representing a symbol, which needs to be further processed according to the convention of the escape mode. As noted above, some aspects of the present invention are in the context of multi-stage decoding, and the description is accordingly continued with respect to multi-stage decoding.

7. Multi-Stage Decoding—Flow Chart

FIG. 4 is a flowchart illustrating the manner in which variable length code-words are decoded in described with reference to decoding in only two stages, merely for illustration. However, the features can be implemented in other environments, and the approaches can be extended to more stages. The flowchart starts in step 401, in which control immediately passes to step 410.

In step 410, variable length decoder (VLD) 210 forms an input data containing K-bits of the bit stream to be decoded, wherein K represents the number of bits for which the first stage lookup is supported.

In step 420, VLD 210 retrieves from a table an entry corresponding to the input data. In step 430, VLD 210 examines the entry to determine whether there is a hit or a miss. A hit implies that the symbol corresponding to the input code can be deciphered from the retrieved entry. Control passes to step 440 in case of a hit and to step 460 otherwise.

In step 440, VLD 210 decodes the symbol from the retrieved entry. In step 450, VLD 450 constructs the next input data as equaling the next K-bits based on the number of bits consumed for the decoding of step 440. The number of bits consumed for step 440 may also be presented in the retrieved entry. Control then passes to step 420

In step 460, VLD 210 may determine the location at which the lookup needs to be continued based on the data in the retrieved entry. In step 470, VLD 210 forms the input data for the present stage of decoding using additional bits from the input stream. In general, the input data is selected from a position following the bits consumed for decoding.

In step 480, VLD 210 retrieves from the table the entry corresponding to the input data. In step 490, VLD 210 decodes the symbol for the input data from the retrieved entry. The method ends in step 499.

If should be appreciated that the flowchart has been presented with reference to two stage only decoding for conciseness and ease of understanding. The generalization of the approach to multiple stages will be apparent to one skilled in the relevant arts by reading the disclosure provided herein. Also, different number of bits can be used for input data of each stage, though the description of above is provided with respect to K bits for both the stages. Such enhancements/modifications are contemplated to be within the scope and spirit of various aspects of the present invention.

The operation of the above-described features is further illustrated with a numerical example in FIGS. 5 and 6.

8. Multi-Stage Decoding—Table Contents Illustrated

FIG. 5 contains a table illustrating an example set of code-words 521 and corresponding run-value pair 523 (symbols). As shown by rows 541-549, code words 10, 110, 1110, 11110, 111110, 1111110, 11111110, 111111110, and 1111111110 respectively represent run-value pairs of (3,8) (4,7) (5,6) (6,5) (7,4) (8,3) (9,2) (10,1) and (11,0). Row 550 contains the code-word representing escape-code. It may be appreciated that simple code-words are chosen merely for illustration, however, typical code-word design are generally more complex.

As may be further appreciated, the length of the longest code-word is 10 (ten). As described below with respect to FIG. 6, the features of the present invention enable tables using shorter input data values (than ten).

FIG. 6 depicts three table portions 691-693 supporting the decoding of symbols, potentially in three corresponding stages. Table portions 691, 692 and 693 respectively containing 32, 29 and 3 entries, though only a subset of the corresponding rows are shown for conciseness. The portions are shown containing columns 661-666 respectively representing serial number, five-bit input data, hit/miss (1/0), symbol (run-value pair), offset for further decoding in case of miss, and number of bits consumed in case of hit. The tables may contain other information columns (e.g., last symbol of the block), but are not shown again for conciseness. Each field of the table is described below.

As can be readily observed, all code-words of 5 bits or less length can be decoded by accessing table portion 691 since that table portion receives 5-bits data as input for lookup. Accordingly, code-words 10, 110, 1110, and 11110 are respectively shown being decoded in rows {613, 614}, {615}, {616} and {617}. As noted above, only the subset of rows are shown in FIG. 6. Thus, the number of rows for code-word 10 would equal 8, though only 2 are shown for illustration.

Row 611 corresponds to the processing of escape code (assuming six zeros represents an escape code). It may be appreciated that a code representing the escape mode follows the escape code and the corresponding look-ups start from a location with 64 as offset (assuming the information corresponding to the escape codes starts at that location). Column 663 (of row 611) indicates that no bits are consumed by the decoding since there is a miss.

Row 618 corresponds to an input data of 11111, representing a miss (0 value in column 663), and requires additional bits for decoding. The corresponding offset value is shown as 32 (from the start of portion 691).

With respect to portion 692, the next five bits from the input stream are used as input for the lookup. As may be appreciated, code-word 111110 would contain 16 entries in portion 692, but only row 621 is shown for conciseness. Row 622 would similarly decode code-word 1111110 (of these 5 ones would have been consumed in the first portion/iteration/lookup and the remaining 10 is decoded in the second portion). Rows 623-625 are similarly described. Row 626 is included merely for completeness, but may not be used while decoding.

With respect to portion 693, rows 631, 632 and 633 respectively correspond to escape codes 1, 2 and 3. There would be a hit in each of the cases (due to the convention used while encoding) and 3 (additional) bits are consumed for each decoding, as shown in column 666. The description is continued with an illustration of how the tables are used for decoding.

9. Multi-Stage Decoding—Numerical Example

For illustration it is assumed that an input stream of 10 110 00000 001 1111110 (spaces added merely for illustration). Thus, 10110 is used as the input data and entry 614 is accessed. Entry 614 indicates a hit (bit 0 in column 663). The corresponding decoded symbol (run-length pair) equals (3,8) from column 614. The offset in column 615 is inapplicable since there is a hit. Column 616 indicates that only 2 of the 5 bits are consumed and thus 110 is available for the next input data.

Thus, 11000 is used as the next input data, and row 615 is accessed in the first stage of operation. Row 615 decodes the first three bits 110 to (4,7) as shown.

The next five bits 00000 are used as the input data causing row 611 to be accessed. The field corresponding to column 611 indicates there is a miss (0), and the field corresponding to column 665 indicates that further search is to be performed from location 64 (offset from the beginning of the table, conveniently). All five bits are deemed to be consumed in case of a miss.

The next five bits 00111 are used as the input data for the next stage lookup in portion 693, and row 631 is accessed. Row 631 indicates that the code corresponds to ESCI mode, and that only 3 bits are consumed for the decoding. Accordingly, the following bits 1111110 are decoded as {8,3} and RMAX (8) is added to 3 (the second component) to effectively generate a code of {8,11} for the bit sequence 00000 001 1111110.

It should be appreciated that all three table portions 691, 692 and 693 are shown accepting 5 bits of input data. As a result, there are several entries which could contain only redundant information. For example, assuming a code-word is of 2 bits only, there would be 8 entries containing the same decoding information (corresponding to the 3 remaining bits). Multi-symbol decoding, along with different sizes for the stages, overcomes such a disadvantage, as described below in further detail.

10. Multi-Symbol Decoding in a Single Lookup

Multiple symbols are decoded within a single lookup, at least in some cases. The feature takes advantage of the fact that some of the bits in input data are unused and these unused positions may be conveniently used to decode another code-word. For example, assuming that the input data is 6 bits long, table entries can be conveniently designed to provide information for code-word pairs of {10, 110}, {10, 1110}.

FIGS. 7A-7C broadly illustrate a decoding approach in which some symbol pairs are decoded in a single lookup, while combining the multi-stage approach described briefly above. In particular, FIG. 7A illustrates the decoding of multiple symbols in a single lookup, and FIGS. 7B and 7C illustrate the single and multi-stage lookup in case multiple symbols cannot be decoded in a single lookup. These three Figures are co-existent in the approach described below.

With respect to FIG. 7A, assuming that location 715 (with offset 711) is retrieved for a data input, field 721 contains a count representing the number of (successive) code-words matched (and contained in the input data). Field 723 would then contain the information on the decoded symbols.

FIGS. 7B and 7C are respectively described similar to FIGS. 3A and 3B, except that field 741 would contain a count of 1, implying that there is a match for only one symbol and field 745 would contain the information corresponding to the decoded system. Similarly, field 781 of location 772 would indicate a miss (count 0), and field 783 would point to location 777 for further lookup.

Various aspects of the present invention enable the resource requirements to be optimized while decoding variable length codes. The features require appropriate support to store inverse-coding table information, and such a storing technique is described with reference to an example table format below.

11. Table Format

Figure 8A:
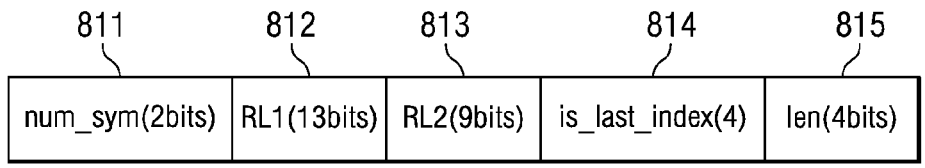
FIGS. 8A and 8B respectively represent the format of memory locations corresponding to the case of a hit for one/two symbols and the case requiring additional processing (either as multi-stage processing or due to escape mode processing) according to various aspects of the present invention.
Figure 8B:
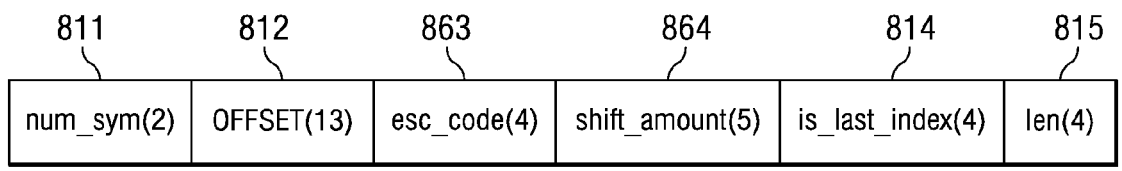

FIGS. 8A and 8B together represent an example format supporting various feature of the present invention. The length of various fields is shown within parenthesis. Broadly, FIG. 8A contains the format of the entries in case at least one code-word can be decoded from the present input data, and FIG. 8B contains the format corresponding to a scenario in which additional lookup operations are needed for decoding the present symbol (either due to encoding according to escape mode processing, or because of multi-stage decoding).

Field (consume count) 815 represents the total number of bits consumed for this access (for one or two codes, as applicable). Field (hit count) 811 indicates a count of the number of hits. If the hit count equals 2, symbol fields 812 and 813 contain the corresponding run-length codes (decoded symbols). If the value equals 1, only field 812 would contain the corresponding run-length code and field 813 is unused.

It may be appreciated that the width (13 bits) of symbol field 812 is more than the width (9 bits) of symbol field 813, though both store the symbol values. Such a feature is implemented based on the recognition that the second decoded symbol would be short in length typically, and thus by using a short width for field 813, the word-width (or number of bits in each word) is efficiently utilized.

Field (is-last index) 814 indicates whether the present code-word is a last symbol of a block. According to an aspect of the present invention, field 814 contains a value of 1 to represent that the present code-word is the last code-word in the block, a large value (e.g., greater than the number of blocks sought to be processed in a loop described below) in case of escape mode 3, and 0 to represent otherwise (i.e., not the end of block and not escape mode 3). Such a convention is used for processing escape mode 3 related code-words, as described in sections below.

FIG. 8B correspond to the case of hit count equaling 0, which implies either that the present symbol is encoded according to escape mode, or that decoding needs to be performed using multi-stage decoding in case the symbol is encoded according to table mode. The two cases are differentiated based on the value stored in escape mode identifier 863. Escape code field 863 contains one of values 0-3 respectively representing table mode and escape modes 1-3.

According to aspect of the present invention, shift amount 864 represents the number of bits to be used in the next stage of decoding. The shift value can be different for different stages, and thus variable length stages can be used for continuation of decoding. As a result, redundant information can be minimized/avoided for decoding short code-words.

According to another aspect of the present invention, shift amount 864 contains a value equaling the word length minus the number of bits to be used in the next stage of decoding. Such storing reduces the computational requirements. The advantage can be appreciated by understanding that the input bit stream may be stored in a word (register), with the input data used for matching the entry according to FIG. 8B being present in the most significant bit (MSB) position.

Generating the input data for continuing the decoding operation would entail left shifting the register by consume count (to rid of the bits already used for decoding), and then right shifting the register by a number of positions equaling the (word length—the number of bits to be used in the next stage). By pre-computing such value and storing the value in shift amount 864, the computational requirements at the time of decoding would be reduced.

The description is continued with respect to the manner in which symbols may be decoded using some of the formats described above in one embodiment.

12. Multi-Symbol Decoding—Flowchart

Figure 9:
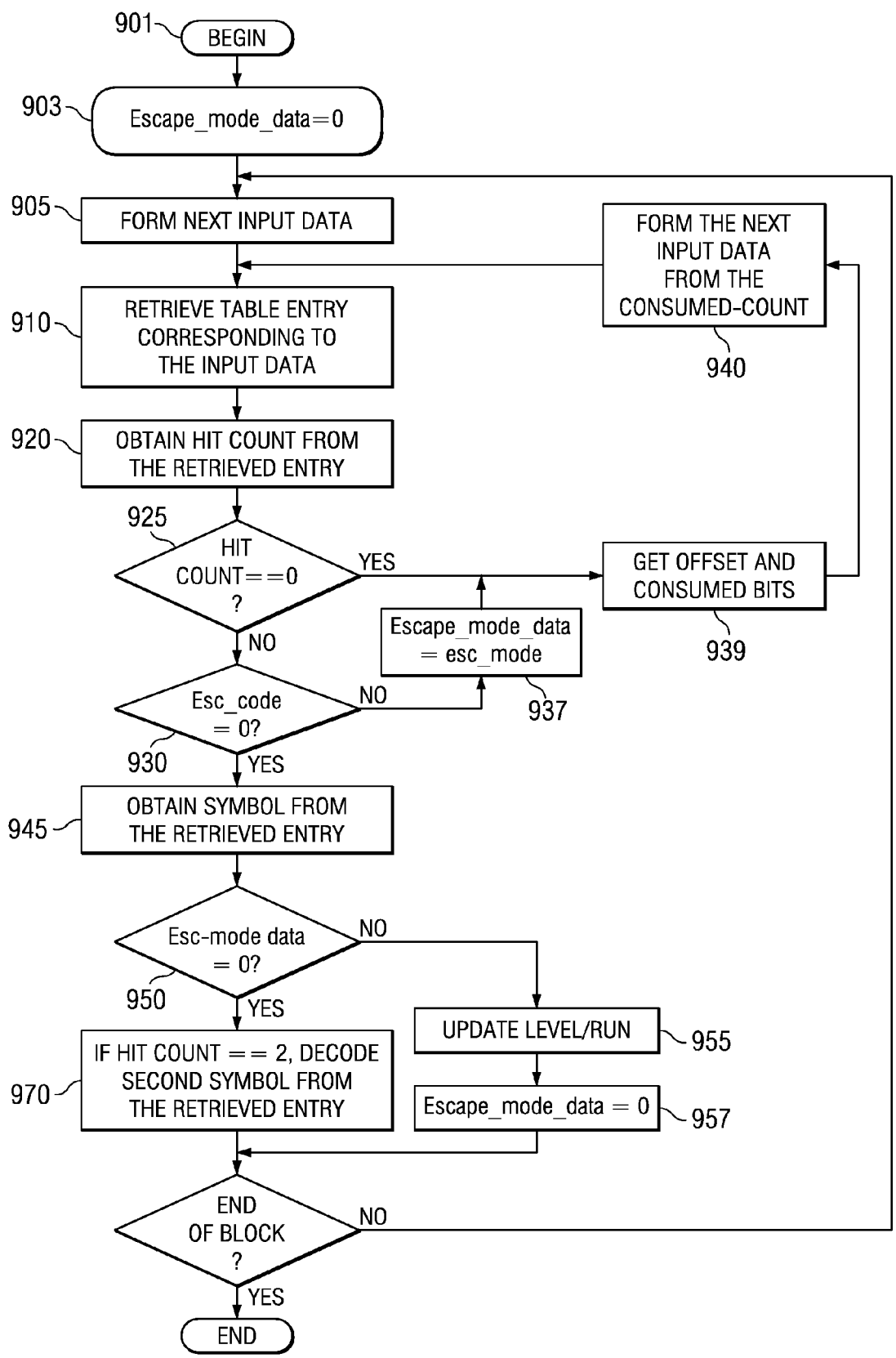
FIG. 9 is a flowchart illustrating the manner in which two code-words (in a bit stream) may be decoded in a single table lookup in an embodiment of the present invention.

FIG. 9 is a flowchart illustrating the manner in which code-words (in a bit stream) may be decoded in an embodiment of the present invention. For illustration, the flowchart is described with respect to the Figures above, however, the features can be implemented in other environments as well. The flowchart starts in step 901, in which control transfers to step 903.

In step 903, VLD 210 initializes variable esc_mode_data to 0. The variable is used to remember the specific escape mode according to which a present symbol is decoded. In step 905, VLD 210 forms the next input data from a input bit stream, for example, from the first N-bits (wherein N represents the number of bits in each input data to be used for look-up operations) to start with. However, the subsequent bits are determined according to the next stage table size.

In step 910, VLD 210 retrieves a table entry corresponding to the input data. Techniques such as indexing (with input data as the index) can be used to locate the table entry. In step 920, VLD 210 obtains the hit count from the retrieved entry. With respect to FIGS. 8A-8B, hit count is present in field 811.

In step 925, VLD 210 determines if hit count equals 0. Control transfers to step 939 if hit count equals 0 (i.e., either escape mode or table mode requiring additional look-up operations) and to step 930 otherwise (symbol information present).

In step 939, VLD 210 obtains offset 812 and shift amount 864 (determining the number of bits for the next lookup/stage). In step 940, VLD 210 forms the next input data from the two obtained values. Control then passes to step 910.

In step 930, VLD 210 examines the value escape code field 863. The value indicates whether the present entry represents an escape mode (by values 1, 2, and 3) or table mode (by value 0). Control passes to step 937 in case of escape mode and to step 945 otherwise. In step 937, the variable escape-mode data is set to the escape mode, and control then transfers to step 939.

In step 945, VLD 210 obtains the symbol from the retrieved entry from field 812 of FIG. 8A. In step 950, VLD 210 checks escape-mode data is set to a valid escape mode value (set in step 937) or not (set in steps 903 or 957). Control passes to step 955 if it is a valid escape mode and to step 970 otherwise.

In step 955, VLD 210 corrects the run or level depending on the specific value escape-mode data is set to. This, corresponding MAXIMUM_LEVEL is added to the level value of the decoded symbol if the escape-mode data represents escape-mode 1, and corresponding MAXIMUM- _RUN is added to the run value of the decoded symbol if the escape-mode data represents escape-mode 2.

In step 957 VLD 210 sets escape-mode data to 0, to start decoding of the next symbol. Accordingly, control transfers to step 905. In step 970, VLD 210 decodes the second symbol from the retrieved entry if hit count equals 2. In step 980, VLD 210 checks whether the decoded word represents the end of block. Control transfers to step 999 if the end of block is reached, or to step 905 otherwise.

Thus, by using the approaches described above, variable stage sizes can be used in decoding of symbols, and multiple symbols can be decoded in a single iteration at least some times. The description is continued with reference to a numerical example.

13. Multi-Symbol Variable Stage Size Decoding—Numerical Example

FIG. 10 is a table corresponding to the Huffman codes of FIG. 5, but designed to facilitate multi-symbol decoding according to various aspects of the present invention. For conciseness, FIG. 10 is described in comparison to FIG. 6.

As may be appreciated, the differences lie in two respects: (1) in FIG. 10, the offset and symbol values are stored in column 1063 (as against using different columns 664 and 665 in FIG. 6), thereby leading to a shorter word-length (hence smaller memory size); and (2) when possible, entries are designed for decoding two symbols, as described in further detail below with examples.

With respect to difference 1 above, rows 1011 and 1018 respectively contain value pairs {64,29) and {32,27} in column 1063, representing the corresponding {offset value, shift amount} in case hit count (column 1062) equals 0. On other hand, the remaining rows of the first stage contain the respective run-value pairs in the same column 1063. Thus, when hit count equals 0, the value in column 1063 is interpreted as offset/shift amount pair and as run-value pair otherwise.

With respect to difference 2 above, row 1014 contains input data 10110 (representing two code-words 10 and 110 according to FIG. 5) in column 1061, hit count 2 in column 1062, decoded run-length pairs {3,8} and {4,7} in column 1063 (corresponding to fields 812 and 813 of FIG. 8A), and consume count of 5 in column 1064.

It may be appreciated that row 1014 contains the combined information corresponding to rows 614 and 615. Thus, in FIG. 6, two iterations would have been required to decode the two corresponding code-words, whereas in FIG. 10, both the code-words are decoded in a single iteration. Rows 1015 and 1023 similarly facilitate decoding of two symbols in a single lookup.

Figure 11:
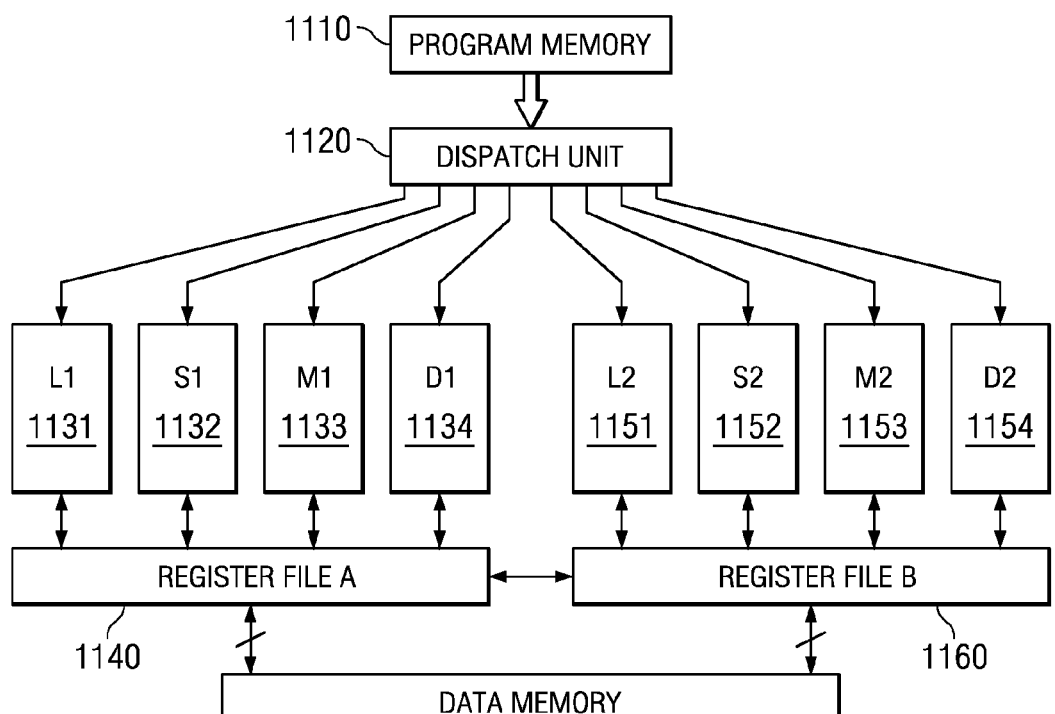
FIG. 11 is a block diagram illustrating the general features of a system implemented according to Very Long Instruction Word (VLIW) architecture.

The description is now continued with respect to the manner in which the input stream of 10 110 00000 001 1111110 (spaces added merely for illustration) can be decoded using the approaches of FIGS. 10 and 11. It may be noted that the manner in which the table of FIG. 6 is used for decoding the same input stream, has been described in sections above.

Continuing with respect to FIGS. 9 and 10, 10110 is used as the first five bit input data, and entry 1014 is retrieved. Using that entry, code words 10 and 110 are respectively decoded as {3,8} and {4,7} run-value pairs, since the hit count in that row equals 2. As the consumed count equals 5, the next five bits 00000 are used as the input data for the next iteration.

Row 1011 would be retrieved, which contains a hit count of 0, causing control to be transferred again to step 905 with an offset of 64 and shift amount equaling 29 (column 1063). The next input data (00111) is then used at offset 64 to retrieve row 1041 (corresponding to input data of 001), which indicates an escape code of mode 1. Three bits are consumed, and the next five bits 11111 are used as the next input data. Here, the escape mode flag will be set with mode 1.

Input data of 11111 causes row 1018 to be retrieved, which indicates a miss operation and an offset of 32 is to be used for the next lookup. The next stage at that location would have input data of 5 bits due to the shift count value of 27. The two bits 10 would decode to a run-value pair of {8,3} by virtue of row 1022. Since there is a valid escape mode, control passes to step 955, where a LMAX of 8 is added to 3, to generate a code of {8, 11}, consistent with the result described above with respect to FIG. 6.

From the above, it may be appreciated that one iteration less is taken for decoding according to FIGS. 9-10. As the smaller codes are expected to exist with higher frequencies (compared to longer codes), the effective throughput performance in decoding may be correspondingly enhanced.

In addition, due to the use of variable length stages (i.e., only 3 bit input data for the stage of locations 1041-1043), the memory space is also more efficiently utilized.

It may be desirable to implement the above described approaches in various types of architectures, which could present corresponding challenges. Various aspects of the present invention optimize resource requirements in Very Long Instruction Word (VLIW) architectures, as described below in further detail. First, a general introduction to VLIW architecture and the corresponding challenges are described briefly below.

14. VLIW Architecture

FIG. 11 is a block diagram illustrating the general features of a system implemented according to Very Long Instruction Word (VLIW) architecture. System 1100 is shown containing program memory 1110, dispatch unit 1120, processing units 1131-1134 and 1151-1154, register files 1140 and 1160, and data memory 1180. Only the details of VLIW architecture as believed to be relevant to an understanding of the operation of the described embodiment are provided in the present application. For further details on VLIW architecture, the reader is referred to a document/book entitled Embedded Image Proc. on the TMS320C6000 DSP by Shehrzad Qureshi, and available from Springer.

Processing units 1151-1154 and register file 1160 may respectively operate similar to processing units 1131-1134 and register file 1140, and the description is not repeated for conciseness. The remaining blocks are described below in further detail.

Program memory 1110 stores instructions, which operate to decode the code-words and generate corresponding symbols. Each processing unit 1131-1134 may be designed to perform corresponding set of operations (add, shift, multiply, conditional operation, etc.). Each processing unit is implemented according to a pipeline architecture, and generates one result each processing cycle in the steady state. Data memory 1180 provides any data required during execution of instructions, and also stores the results of execution of instruction, if necessary.

Dispatch unit 1120 retrieves small sets of instructions from program memory 1110 and schedules the instructions for execution on a suitable processing unit. Each set of instructions is dispatched to the corresponding processing unit. Each of such set of instructions is preferably a loop that executes for many iterations, and the sub-sets should be executable in parallel such that parallelism can be exploited to the fullest in the pipeline architecture.

Register file 1140 contains multiple registers used by processing units during execution. Some of the registers ("predicate registers") are used for conditional execution of single instructions. Generally, an instruction can be specified associated with a predicate register, and the instruction is executed (or completed) only if the predicated register is set to 1, otherwise the instruction is not executed.

Only a small number of such predicate registers (e.g., 6) are available, in one embodiment. The predicate registers may be designed (in hardware) such that the pipeline throughput performance is not impacted at least substantially. While the execution of instructions based on such predicate registers may not substantially impede the throughput performance, branch instructions may cause the throughput performance to be reduced substantially. Accordingly, it is desirable that the number of instructions processed conditionally be reduced.

Also, it may be appreciated that higher throughput performance may be obtained if consecutive loop iterations are independent of each other, i.e., the current loop iteration should not depend on the computations of the previous iteration. Otherwise, the next iteration cannot start till the current one has finished its computations. This condition can be quantified as the loop-carry dependency (LCD) bound. It is defined as the minimum delay required, from the point of start of the current iteration, to the point where the next iteration can start. The set of instructions contributing to the LCD bound form the critical path.

Thus, it may be appreciated that conditional processing may impose substantial penalties in terms of throughput performance in VLIW architectures. The manner in which the conditional processing is avoided in decoding the code-words, is described below in further detail.

15. Avoiding Conditional Processing in Decoding of Symbols

According to an aspect of the present invention, neutral arithmetic operations (addition/subtraction of 0 or multiplication/division by 1) are used to avoid conditional processing. The neutral arithmetic operations may be conveniently supported by arrays, which are described with reference to FIGS. 12A and 12B first. The description is then continued with respect to a flowchart illustrating the manner in which the arrays are used.

Figures 12A, 12B, 14:
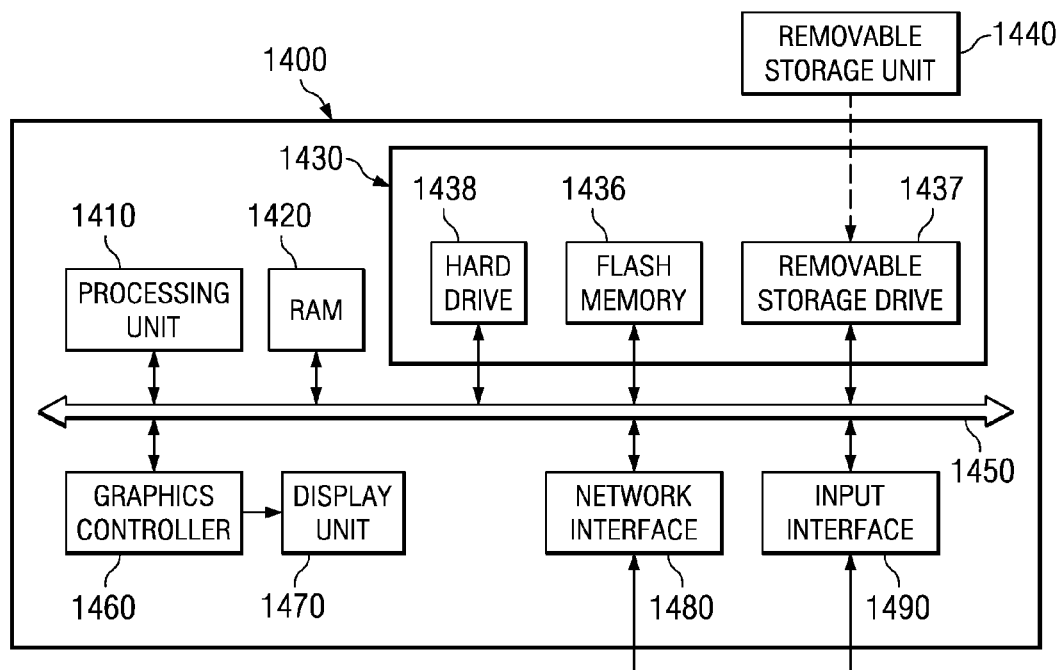
FIG. 12A is a two dimensional array used to update a level value in case the code-word corresponds to escape mode 1, while causing a neutral arithmetic operation to be performed in other cases.
FIG. 12B is a two dimensional array used to update a run value in case the code-word corresponds to escape mode 2, while causing a neutral arithmetic operation to be performed in other cases.
FIG. 14 is a block diagram of a computer system illustrating an example embodiment in which various aspects of the present invention are operative when software instructions are executed.

FIG. 12A is a two dimensional array used to update a level value in case the code-word corresponds to escape mode 1, while causing a neutral operand to be used for the same arithmetic operation in other cases. The two dimensional array (level-at-run) is shown containing rows 1211-1213 and columns 1231-1237. Rows 1211-1213 corresponds to three escape modes mode0, mode1, and mode 2. Columns 1231-1237 corresponds to different run values at which each received levels is encoded in escape mode 1.

The entries in row 1212 (corresponding to escape mode 1) is shown having a LMAX value (corresponding to the run value) required to be added (corrected) to the corresponding decoded level value (from the decoded run-level pair) in case of escape mode 1. On the other hand, entries in row 1211 and row 1213 (corresponding to escape mode 0 and 2) are shown having 0 (neutral operand, given that the operation is addition) value.

Accordingly, as described below with respect to FIG. 13 in further detail, the level value (generated by table lookup) is added to a value indexed by the escape mode and the run value to attain the desired correction only in case of mode 1 and to not disturb the decoded value in other cases.

It may be appreciated that due to the use of neutral operand 0 value the decoded level value is unchanged when the escape mode is mode 0 or mode2, and the corresponding LMAX is added to decoded level when escape mode is 1. As a result, the level values remain un-altered for escape modes0 and 2 as desired and a desired correction is made for escape mode1.

Similarly, a two dimensional array (run-at-level) for updating run value incase of escape mode 2 is shown in FIG. 12B. The run-at-level array there is shown containing rows 1261-1263 and columns 1281-1287. Rows 1261-1263 corresponds to three escape modes mode0, mode1, and mode 2 and columns 1281-1287 corresponds to different level values at which each received run is encoded in escape mode 2.

Entries in rows 1261 and 1262 are shown having 0 value and entries in row 1263 is shown having the corresponding RMAX+1 (a desired correction). Each run value obtained by table lookup is added to a value in the array indexed by escape mode and received level value. As a result, run values remain un-altered for escape mode 0 and mode1.

While addition by only corresponding value of RMAX is required in case of escape mode 2, the entries there are shown containing (RMAXi+1), wherein i represents the corresponding level value. The higher value can be appreciated by understanding the manner in which the decoded run/value pair is used, as described below.

Broadly, an array representing the input to the inverse zigzag unit 220 is generated from the run-value pair. The array is first initialized to 0s, and the decoded value is written after a number of 0s equal to run. Since the value needs to be stored at a position after the end of the run of 0s, (RMAXi+1) provides an index into the array at which the value is to be stored. By storing such values, the computational requirements during decoding are reduced further.

It may be observed that each row and column of the two arrays may be indexed by the escape mode data (representing the escape mode) and a run value for level at run array and a level value incase of a run at level array. Such an observation is used to provide a common addition operations for all of mode 0, mode 1 and mode 2, thereby avoiding conditional addition operation, as described below in further detail.

Figure 13:
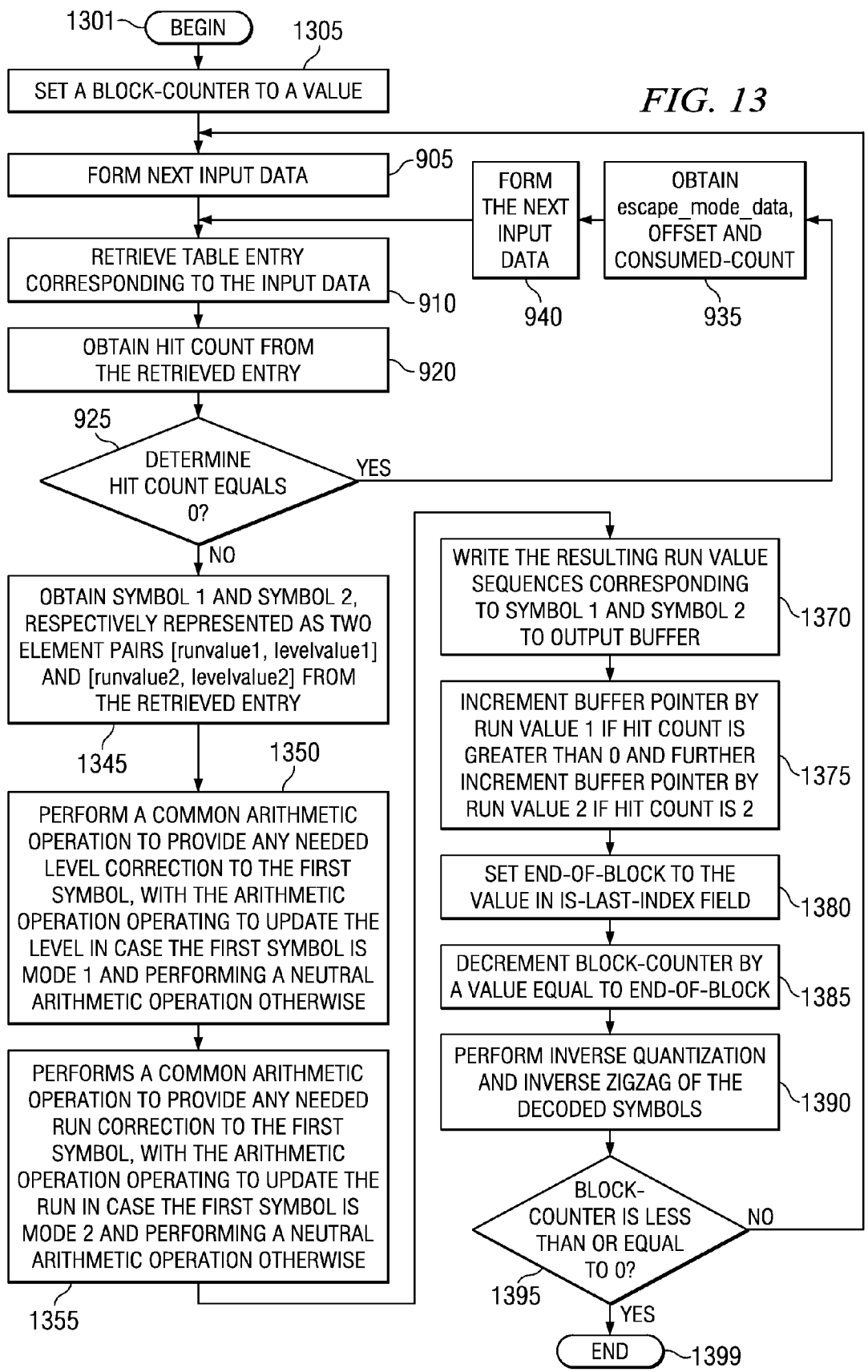
FIG. 13 is a flowchart illustrating the manner in which code-words (in a bit stream) may be decoded while avoiding various conditional processing operations in an embodiment of the present invention.

FIG. 13 is a flowchart illustrating a manner in which code-words (in a bit stream) may be decoded while avoiding various conditional processing operations in an embodiment of the present invention. Flowchart in FIG. 13 is shown containing various steps (905, 910, 920, 925, 935 and 940) of the flowchart in FIG. 9 for conciseness and ease of understanding. The description of such steps is not provided again in detail, in the interest of conciseness. The flowchart begins in step 1301 and control transfers to step 1305.

In step 1305, VLD 210 sets a block-counter to a value. Typically the block counter value is set to the number of blocks in a macro block. As a result, all the symbols comprised in a macro block are decoded in a single execution of the flowchart of FIG. 13 (under many cases), thereby providing higher number of instructions per cycle (IPC).

In step 905, VLD 210 forms next input data. In step 910, VLD 210 retrieves table entry corresponding to the input data. In step 920, VLD 210 obtains hit count from the retrieved entry. In step 925, VLD 210 determines if hit count equals 0. Control transfers to step 935 if hit count equals 0, and to step 1345 otherwise. In step 935, VLD 210 obtains offset 812, shift amount 864 (determining the number of inputs for the next lookup/stage), and consumed bit count 815 from the entry retrieved in step 910. In step 940, VLD 210 forms the next input data. Control then passes to step 910.

In step 1345, VLD 210 obtains symbol1 and symbol 2, respectively represented as two element pairs [runvalue1, levelvalue1] and [runvalue2, levelvalue2] from the retrieved entry. The element value pairs [runvalue1, levelvalue1] and [runvalue2, levelvalue2] are respectively extracted from fields 812 and 813, described above.

In step 1350, VLD 210 performs a common arithmetic operation to provide any needed level correction to the first symbol, with the arithmetic operation operating to update the level in case the first symbol is mode 1 and performing a neutral arithmetic operation otherwise. Such a result may be obtained by using the array of FIG. 12A described above. The common arithmetic operation is given as levelvalue1+=level-at-run[escape-mode data][runvalue1], wherein run-at-level represents the two dimensional array of FIG. 12A.

In step 1355, VLD 210 performs a common arithmetic operation to provide any needed run correction to the first symbol, with the arithmetic operation operating to update the run in case the first symbol is mode 2 and performing a neutral arithmetic operation (using a neutral operand) otherwise. The common arithmetic operation is given as: runvalue1+=run-at-level[escape-mode data][levelvalue1], wherein level-at-run represents the two dimensional array of FIG. 12B.

In step 1370, VLD 210 writes the resulting run value sequences corresponding to symbol 1 and symbol 2 to output buffer. For example, assuming a run value pair equals {3,4}, VLD 210 writes three 0s followed by a value 4 in the output buffer. As described above, due to the storing of (RMAXi+1) values in the array of FIG. 12B, the computational requirements are reduced and the value can be stored in the desired location easily.

In step 1375, VLD 210 increments buffer pointer by run value 1 if hit count is greater than 0 and further increments buffer pointer by run value 2 if hit-count is 2. It should be appreciated that the storing and increment operations of steps 1370 may be conveniently interspersed.

In step 1380, VLD 210 sets end-of-block variable to a value in the is-last-index field 814 (of the presently accessed entry) described above. As described above, the value equals 1 in case the present code-word is at end of block also, equals a large number (bigger than the initial value of block counter set in step 1305) in case of escape mode 3, and 0 otherwise.

In step 1385, VLD 210 decrements block-counter by a value equal to end-of-block variable. Thus, the block-counter keeps track of the number of blocks decoded thus far if escape mode 3 code-word is not received. Once code-word corresponding to escape mode 3 is received, block counter becomes a negative value.

In step 1390, VLD 210 performs inverse quantization and inverse zigzag of the decoded symbols. In step 1395, VLD 210 checks if block-counter is less than or equal to 0. Control passes to step 1399 if block counter is less than or equal to 0, and to step 1310 otherwise. Thus, the loop ends when the number of blocks set in step 1305 are processed or if code-word corresponding to escape mode 3 is received. Flowchart ends in step 1399.

From the above, it may be appreciated that the large blocks processed under if conditions of FIG. 9 are avoided in the approach according to FIG. 13. The throughput performance of VLD 210 may be enhanced at least in case of implementations in VLIW architectures.

In addition, as the inverse Zigzag and quantization operations substantially use multiplication operations (requiring different processing units than the decoding operations), further parallelism can be obtained for correspondingly higher throughput performance.

It should also be appreciated that the features described above may be implemented in various combinations of hardware, software and firmware, depending on the corresponding requirements. The description is continued with respect to an embodiment in which the features are operative upon execution of the corresponding software instructions.

16. Digital Processing System

FIG. 14 is a block diagram of computer system 1400 illustrating an example system for implementing the decoder noted above. Computer system 1400 may contain one or more processors such as central processing unit (CPU) 1410, random access memory (RAM) 1420, secondary memory 1430, graphics controller 1460, display unit 1470, network interface 1480, and input interface 1490. All the components except display unit 1470 may communicate with each other over communication path 1450, which may contain several buses as is well known in the relevant arts. The components of FIG. 14 are described below in further detail.

CPU 1410 may execute instructions stored in RAM 1420 to provide several features of the present invention. CPU 1410 may contain multiple processing units, with each processing unit potentially being designed for a specific task. Alternatively, CPU 1410 may contain only a single processing unit. RAM 1420 may receive instructions from secondary memory 1430 using communication path 1450. In addition, RAM 1420 may store the various buffers/arrays described above.

Graphics controller 1460 generates display signals (e.g., in RGB format) to display unit 1470 based on data/instructions received from CPU 1410. Display unit 1470 contains a display screen to display the images defined by the display signals. The decoded video frames may be displayed on the display screen. Input interface 1490 may correspond to a keyboard and/or mouse, and generally enables a user to provide inputs. Network interface 1480 enables some of the inputs (and outputs) to be provided on a network.

Secondary memory 1430 may contain hard drive 1438, flash memory 1436 and removable storage drive 1437. Secondary storage 1430 may store the software instructions and data (e.g., the VLC tables), which enable computer system 1400 to provide several features in accordance with the present invention.

Some or all of the data and instructions may be provided on removable storage unit 1440, and the data and instructions may be read and provided by removable storage drive 1437 to CPU 1410. Floppy drive, magnetic tape drive, CD-ROM drive, DVD Drive, Flash memory, removable memory chip (PCMCIA Card, EPROM) are examples of such removable storage drive 1437.

Removable storage unit 1440 may be implemented using medium and storage format compatible with removable storage drive 1437 such that removable storage drive 1437 can read the data and instructions. Thus, removable storage unit 1440 includes a computer readable storage medium having stored therein computer software and/or data. An embodiment of the present invention is implemented using software running (that is, executing) in computer system 1400.

In this document, the term "computer program product" is used to generally refer to removable storage unit 1440 or hard disk installed in hard drive 1431. These computer program products are means for providing software to computer system 1400. As noted above, CPU 1410 may retrieve the software instructions, and execute the instructions to provide various features of the present invention described above.

17. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of avoiding conditional processing in a situation in which an arithmetic operation on an input variable is to be performed in a first condition using an operand value, but not in a second condition, wherein said arithmetic operation would potentially change the value of said variable, said method comprising:
setting an operand variable to said operand value in said first condition and to a neutral operand in case of said second condition, wherein said neutral value does not cause a change to any variable when said arithmetic operation is performed; and
performing said arithmetic operation using said operand variable in both said first condition and said second condition.

2. The method of claim 1, wherein said setting comprises:
providing an array addressable by an index;
setting said array at a first position to equal said operand value and at a second position to equal said neutral operand; and
setting a temporary variable to equal said first position in said first condition and to said second position in said second condition,
wherein said operand variable equals said array indexed by said temporary variable.

3. The method of claim 2, wherein said variable comprises a run of a run-level pair representing a symbol which is decoded according to escape mode 0, escape mode 1 or escape mode 2, wherein said first condition comprises escape mode 2 and said second condition comprises escape mode 0 or escape mode 1.

4. The method of claim 3, further comprising a table used for decoding a plurality of code-words into a corresponding plurality of symbols, wherein said table provides an output entry corresponding to an input data containing at least one of said code-words, wherein a field of said output entry indicates whether the corresponding code-word following the present code-word is encoded according to escape mode 0, escape mode 1 or escape mode 2, wherein said setting comprises storing the value of said field in said temporary variable.

5. The method of claim 4, wherein said operand value equals (a run value +1) for each corresponding level.

6. The method of claim 5, further comprising:
initializing a plurality of locations of an output buffer to 0;
storing each level at a location indexed by (a present location+said operand value); and
adding said operand value to said present location.

7. The method of claim 2, wherein said variable comprises a level of a run-level pair representing a symbol which is decoded according to escape mode 0, escape mode 1 or escape mode 2, wherein said first condition comprises escape mode 1 and said second condition comprises escape mode 0 or escape mode 2.

8. The method of claim 1, wherein said neutral operand equals 0 in case said arithmetic operation is addition/subtraction and 1 in case said arithmetic operation is multiplication/division.

9. A computer readable medium carrying one or more sequences of instructions for causing a system to avoid conditional processing in a situation in which an arithmetic operation on an input variable is to be performed in a first condition using an operand value, but not in a second condition, wherein said arithmetic operation would potentially change the value of said variable, wherein execution of said one or more sequences of instructions by one or more processors contained in said system causes said one or more processors to perform the actions of:
setting an operand variable to said operand value in said first condition and to a neutral operand in case of said second condition, wherein said neutral value does not cause a change to any variable when said arithmetic operation is performed; and
performing said arithmetic operation using said operand variable in both said first condition and said second condition.

10. The computer readable medium of claim 9, wherein said setting comprises:
providing an array addressable by an index;
setting said array at a first position to equal said operand value and at a second position to equal said neutral operand; and
setting a temporary variable to equal said first position in said first condition and to said second position in said second condition,
wherein said operand variable equals said array indexed by said temporary variable.

11. The computer readable medium of claim 10, wherein said variable comprises a run of a run-level pair representing a symbol which is decoded according to escape mode 0, escape mode 1 or escape mode 2, wherein said first condition comprises escape mode 2 and said second condition comprises escape mode 0 or escape mode 1.

12. The computer readable medium of claim 11, further comprising a table used for decoding a plurality of code-words into a corresponding plurality of symbols, wherein said table provides an output entry corresponding to an input data containing at least one of said code-words, wherein a field of said output entry indicates whether the corresponding code-word following the present code-word is encoded according to escape mode 0, escape mode 1 or escape mode 2, wherein said setting comprises storing the value of said field in said temporary variable.

13. The computer readable medium of claim 12, wherein said operand value equals (a run value +1) for each corresponding level.

14. The computer readable medium of claim 12, further comprising:
initializing a plurality of locations of an output buffer to 0;
storing each level at a location indexed by (a present location+said operand value); and
adding said operand value to said present location.

15. The computer readable medium of claim 10, wherein said variable comprises a level of a run-level pair representing a symbol which is decoded according to escape mode 0, escape mode 1 or escape mode 2, wherein said first condition comprises escape mode 1 and said second condition comprises escape mode 0 or escape mode 2.

16. The computer readable medium of claim 9, wherein said neutral operand equals 0 in case said arithmetic operation is addition/subtraction and 1 in case said arithmetic operation is multiplication/division.

* * * * *